(12) United States Patent
Boaron (10) Patent No.: US 10,616,990 B2
(45) Date of Patent: Apr. 7, 2020

(54) PCB APPARATUS AND METHODS AND COMPUTER PROGRAM PRODUCTS FOR MANUFACTURING SAME

(71) Applicant: Elta Systems Ltd., Ashdod (IL)

(72) Inventor: Yaniv Boaron, Kfar Saba (IL)

(73) Assignee: ELTA SYSTEMS LTD., Ashdod (IL)

( * ) Notice: Subject to any disclaimer, the term of this patent is extended or adjusted under 35 U.S.C. 154(b) by 0 days.

(21) Appl. No.: 16/223,862

(22) Filed: Dec. 18, 2018

(65) Prior Publication Data

US 2019/0191540 A1    Jun. 20, 2019

(30) Foreign Application Priority Data

Dec. 20, 2017  (IL) .......................................... 256447

(51) Int. Cl.
*H05K 1/02* (2006.01)
*H05K 1/11* (2006.01)
(Continued)

(52) U.S. Cl.
CPC ......... *H05K 1/0201* (2013.01); *H05K 1/0225* (2013.01); *H05K 1/181* (2013.01);
(Continued)

(58) Field of Classification Search
CPC . H05K 1/02; H05K 1/11; H05K 1/116; H05K 1/0243; H05K 3/34; H01P 1/38; H01P 1/387
(Continued)

(56) References Cited

U.S. PATENT DOCUMENTS

| | | | | |
|---|---|---|---|---|
| 5,451,720 A | * | 9/1995 | Estes | H05K 1/0201 |
| | | | | 174/250 |
| 5,473,813 A | * | 12/1995 | Chobot | H05K 1/0201 |
| | | | | 228/180.1 |

(Continued)

FOREIGN PATENT DOCUMENTS

JP       2015201528 A       11/2015

OTHER PUBLICATIONS

MMCX connector, revision Nov. 20, 2017; download Apr. 18, 2019, from https://en.wikipedia.org/w/index.php?title=MMCX_connector&oldid=811315374.
(Continued)

*Primary Examiner* — Xiaoliang Chen
(74) *Attorney, Agent, or Firm* — Browdy and Neimark, PLLC (57) ABSTRACT

Printed circuit board (PCB) apparatus comprising an apertured ground plane defining aperture pattern/s in the ground plane, each aperture pattern including apertures which, taken together, surround most but not all of SMT footprint/s and are interspersed with ground plane region/s which provide/s the SMT component with electrical connectivity to area/s of said ground plane other than said SMT footprint, thereby to maintain functionality of the SMT component including electrical connectivity between said SMT footprint and area/s of said ground plane other than said SMT footprint, while also slowing heat dissipation from the SMT footprint by restricting thermal conductivity between said area and said area's vicinity thereby to raise the temperature in the SMT footprint while a SMT component is being soldered thereto, thereby to at least partly prevent improper soldering of the SMT component which may cause the SMT component to subsequently detach from the board.

22 Claims, 10 Drawing Sheets

(51) Int. Cl.
*H05K 3/34* (2006.01)
*H01P 1/38* (2006.01)
*H01P 1/387* (2006.01)
*H05K 1/18* (2006.01)

(52) U.S. Cl.
CPC ........... *H05K 3/341* (2013.01); *H05K 3/3494* (2013.01); *H05K 1/0209* (2013.01); *H05K 1/111* (2013.01); *H05K 2201/062* (2013.01); *H05K 2201/093* (2013.01); *H05K 2201/1006* (2013.01); *H05K 2201/10189* (2013.01)

(58) Field of Classification Search
USPC ................ 174/260, 250, 252, 257; 257/713; 333/1.1
See application file for complete search history.

(56) References Cited

U.S. PATENT DOCUMENTS

| | | |
|---|---|---|
| 6,853,091 B2 | 2/2005 | Miyajima |
| 7,759,604 B2 | 7/2010 | Stauffer et al. |
| 8,350,157 B2 | 1/2013 | Lai et al. |
| 2004/0042180 A1 | 3/2004 | Yamaguchi |
| 2010/0026409 A1* | 2/2010 | Carr ........................ H01P 1/387 333/1.1 |
| 2011/0009478 A1 | 1/2011 | Reneke et al. |

OTHER PUBLICATIONS

Ground plane, revision Jun. 23, 2017; downloaded Apr. 18, 2019, from https://en.wikipedia.org/w/index.php?title=Ground_plane&oldid=787060152.

Surface-mount technology, revision Oct. 31, 2017, downloaded Apr. 18, 2019, from https://en.wikipedia.org/w/index.php?title=Surface-mount_technology&oldid=807955187.

Eagle quick-tip: thermal relief for those GND pins, Jan. 24, 2012; downloaded Apr. 18, 2019, from https://blog.adafruit.com/2012/01/24/eagle-quicktip-thermal-relief-for-those-gnd-pins/.

* cited by examiner

PCB APPARATUS AND METHODS AND COMPUTER PROGRAM PRODUCTS FOR MANUFACTURING SAME

REFERENCE TO CO-PENDING APPLICATIONS

None.

FIELD OF THIS DISCLOSURE

The present invention relates generally to electronic boards formed on printed circuit boards generally, and more particularly to RF boards or radio frequency printed circuit boards.

BACKGROUND FOR THIS DISCLOSURE

The PCB industry considers an RF circuit board to include any PCB that operates at a "high" frequency, e.g. a radio frequency. A subclass of RF circuit boards are microwave PCBs, i.e. any PCB that operates at a frequency 20 KHz to 300 GHz.

RF boards have a wide number of applications or usecases, such as, but not limited to, wireless systems such as Wi-Fi-routers and other wireless local area networking technologies, smart phones or cellular phones, sensors, robots and security systems. RF board manufacturers include Apple, Samsung, Nokia, Agilent, and analog devices. RF boards often, but not necessarily, have transmitter/receiver functionality. RF boards (or RF cards), when empty, may be termed RF PCBs, and, once assembled, may be termed RF PCB assemblies, or RF modules.

Wikipedia indicates that "MMCX (micro-miniature coaxial) connectors are coaxial RF connectors similar to MCX, but smaller, conforming to the European CECC 22000 specification.

The connectors have a lock-snap mechanism allowing 360-degree rotation and usually have a 50Ω impedance. They offer broadband capability from DC to 6 GHz. MMCX connectors are most commonly seen on Wi-Fi PCMCIA cards as antenna connectors or as connectors for external GPS antennas on small devices like PDAS or GPS receivers. They are also used by various brands of in-ear monitors to connect the cable to the individual earpieces. This allows for the cables to be replaced or swapped. MMCX is also used in some video transmitters for first-person view (FPV) radio control piloting. This makes swapping antennas and repairing easier than with U.FL connectors.

Wikipedia teaches that a ground (GND) plane on a printed circuit board (PCB) may comprise an area or layer of copper foil connected to the circuit's ground point, usually one terminal of the power supply which may serve as the return path for current from various components. A ground plane often covers most of the PCB area not occupied by circuit traces. In multilayer PCBs, the ground plane may be a separate layer covering the entire board. The ground plane, due to its size, typically ensures that the components' respective ground connection are all at the same reference potential since it conducts large return currents from many components without significant voltage drops. In radio frequency PCBs, ground planes may reduce electrical noise and interference through ground loops and/or prevent crosstalk between adjacent circuit traces. When digital circuits switch state, large current pulses flow from the active devices (transistors or integrated circuits) through the ground circuit. If the power supply and ground traces have large impedance, the voltage drop across them may create noise voltage pulses that disturb other parts of the circuit (ground bounce). Since the conducting area of the ground plane has, due to its large size, far lower impedance than that in a circuit trace, current pulses cause less disturbance when a ground plane is provided. A ground plane under printed circuit traces may reduce crosstalk between adjacent traces. In crosstalk, an electrical signal in one trace is coupled into another adjacent parallel trace through electromagnetic induction by magnetic field lines from one trace linking the other. However, if a ground plane layer is underneath, the ground plane forms a transmission line with the trace in which case the oppositely-directed return currents flow through the ground plane directly beneath the trace, thereby to reduce crosstalk by confining most of the electromagnetic fields to the area near the trace. A power plane may be used in addition to a ground plane in a multilayer circuit board, to distribute DC power to the active devices. The two facing areas of copper create a large parallel plate decoupling capacitor that prevents noise from being coupled from one circuit to another through the power supply. Ground planes may be split into plural planes respectively connected by a thin trace to allow separation of analog and digital sections of a board or inputs and outputs of amplifiers. The trace is typically thin enough to provide impedance low enough to keep the two ground planes close to the same potential while preventing the ground currents of one side from coupling into the other side, causing ground loop.

Wikipedia states that "surface-mount technology (SMT) is a method for producing electronic circuits in which the components are mounted or placed directly onto the surface of printed circuit boards (PCBs). An electronic device so made is called a surface-mount device (SMD). In industry it has largely replaced the through-hole technology construction method of fitting components with wire leads into holes in the circuit board. Both technologies can be used on the same board, with the through-hole technology used for components not suitable for surface mounting such as large transformers and heat-sinked power semiconductors."

Each component on a printed circuit board (PCB), whether SMT or through hole, has a footprint or land pattern on the PCB. SMT footprints are differentiable from through hole footprints; an SMT footprint of a specific SMT component comprises surface-mount technology pads in the PCB, typically in the component/solder side (CS/SS) layer thereof, whose arrangement matches the arrangement of leads on the specific SMT component and which are later used to both mechanically attach and electrically connect that specific SMT component to the printed circuit board.

A through-hole footprint of a specific through-hole component comprises through-holes provided in the PCB whose arrangement matches the arrangement of leads on the specific through-hole component. These through-holes are later used to both mechanically attach and electrically connect that specific through-hole component to the printed circuit board.

Typically, but not necessarily, the footprint of each component is designated e.g. in white, in a silkscreen layer, in which, typically, material is deposited in certain locations to be indicated (e.g. a footprint), and not in other areas. Even in the absence of a silkscreen layer e.g. in PCBs whose "real estate" is very dense, such as those in state of the art cellphones, the footprints' locations are known from the PCB's documentation e.g. assembly drawings.

US2011094787 A1 describes a printed circuit board which includes a layer. A layer of copper is covered on a surface of the layer. A through-hole passes through the printed circuit board. A number of thermal engravings are defined in the layer around the through-hole. Each thermal engraving is a groove defined in the surface of the layer, without being covered with the layer of copper. The number of thermal engravings are not in contact with each other. The printed circuit board (PCB) includes a ground layer and other layers such as signal layers. The PCB defines a through-hole through the ground layer and the other layers. A layer of copper is arranged on a surface of the ground layer. The ground layer defines four thermal engravings. A component may be mounted on the PCB by inserting a lead of the component through the through-hole and then soldering the lead in place on an opposite side of the printed circuit board. The lead of the component is electrically connected to the ground layer and other layers, to transmit signals between layers of the PCB and the component. As a result, when the lead of the component is inserted through the through-hole, heat dissipation is slower because of relatively less copper in the area of the through-hole due to the existence of the thermal engravings. The temperature in the through-hole of the PCB is higher than in the through-hole of the conventional PCB during soldering, and the thicker the ground layer, the greater the difference in temperature. The higher temperature is indicative of the slower heat dissipation in the area of the through-hole during soldering, meaning fault formation is decreased or even eliminated.

U.S. Pat. No. 8,350,157 describes a printed circuit board. A layer of copper is covered on a surface of the layer. A through-hole passes through the printed circuit board. An approximately C-shaped thermal engraving is defined in the surface of the layers, surrounding the through-hole and without being covered by the layer of copper. An opening of the thermal engraving faces an output terminal of the power supply. The printed circuit board (PCB) includes a power supply, a power layer and other layers such as a ground layer and signal layers. The PCB defines a through-hole through the power layer and the other layers. A layer of copper is arranged on a surface of the power layer. The power layer defines a thermal engraving. The temperature in the through-hole of the PCB is higher than in the through-hole of the conventional PCB during soldering, and the thicker the ground layer, the greater the difference in temperature. The higher temperature is indicative of the slower heat dissipation in the area of the through-hole during soldering, meaning fault formation is decreased or even eliminated. In other embodiments, thermal engraving is arranged in another layer, say a ground layer of the PCB. In addition, a shape of the groove of the thermal engraving may be changed.

U.S. Pat. No. 6,853,091 describes a printed circuit board and soldering structure for soldering electronic parts thereto. A printed circuit board having circuit patterns printed thereon has a plurality of composite lands each including a first land having a terminal hole formed at its center for inserting the terminal of a selected electric or electronic part or device, and a plurality of second lands each being contiguous to and extending outwards from the first land. The areas contiguous to the contours of the first and second lands have no conductive foils, such as copper foils, thereon, such that the substrate surface of the printed circuit board is exposed in these areas. The exposed areas effectively confine the thermal energy in the limited areas for soldering. Additionally, the composite land shape defines a ridged cone-like solder lump, which can fixedly grip the terminal of the part or device.

U.S. Pat. No. 7,759,604 describes a method for high-precision fixing of a miniaturized component on a support plate. The miniaturized component may have a micro-optical element, on a predetermined fixing section of a support plate by a solder joint. The support plate is formed throughout from a metallic material and has a cut-out region which encloses the fixing section, is bridged by at least one connecting web of the support plate, keeps the heat transfer from the fixing section to the remaining support plate low and compensates lateral thermal expansions of the fixing section. Solder material) is applied on the top of the fixing section. The method comprises in particular the steps: arrangement of the component above the fixing section, the solder material and the base of the component being present in opposite positions without contact and forming a space; supply of electromagnetic radiation to the bottom of the fixing section for melting the solder material so that, as a result of drop formation and optionally as a result of lowering of the component the space fills with molten solder material for mutual fixing.

U.S. Pat. No. 5,473,813 describes methods of forming electronic multi-layer printed circuit boards and/or cards and electronic packages including said boards or cards. The method includes the step of forming a plurality of conductive planes. The conductive planes include ground, signal, or power planes. At least one through-hole is formed through at least one of the conductive planes. An electrically conductive material is deposited onto an inside surface of the at least one through-hole to form a plated through-hole. At least one thermal relief passage is formed at least in the at least one of the conductive planes for preventing the diffusion of heat throughout the circuit board or card during the securing or removal of chips or other components to the circuit board or card by heating the material deposited in the at least one through-hole to a temperature above its melting point. The at least one thermal relief passage is located in the vicinity of the at least one through-hole and is free from electrical connection therewith. An electrically insulating material is deposited on at least one side of each of the conductive planes. The planes are placed on top of each other such that a layer of electrically insulating material is located between each of the conductive planes. The conductive planes are joined together to form the multi-layer circuit board or card.

The adafruit.com blog posted the following at the following www location: https://blog.adafruit.com/2012/01/24/eagle-quicktip-thermal-relief-for-those-gnd-pins/: "Have you ever had a pin on a 0.1" header that you just couldn't get to reflow properly, especially with lead free solder (which requires a higher temperature to work with)? If so, it was almost certainly a GND pin connected to a large GND plane. The problem is that the GND plane dissipates a lot of the heat from the soldering iron. You can try using a much larger tip (larger tips do a better job of conducting heat that small ones), and/or you may need to jack the heat up quite a bit, but sometimes it just won't reflow well to form a solid joint. The solution is easy, but you need to keep the problem in mind when designing the PCB. What you need to add on any GND pin connected to a GND plane (a large area of copper connected to GND) is to restrict the connection to GND to a single bridge, limiting the other areas with layers 41 (tRestrict) or 42 (bRestrict). Just select the rectangle tool and draw a small rectangle beside the pad over 3 of the four bridges, and you should have a MUCH easier time soldering those pins on after the fact. This can also be a good idea with certain large surface-mount parts."

Acronyms include:
RF: radio frequency
PCB: printed circuit board
SMT: surface mount technology
GND: ground The disclosures of all publications and patent documents mentioned in the specification, and of the publications and patent documents cited therein directly or indirectly, are hereby incorporated by reference. Materiality of such publications and patent documents to patentability is not conceded.

SUMMARY OF CERTAIN EMBODIMENTS

SMT components are becoming more common and through-hole components are becoming less common, since the latter are less parsimonious of the available "real estate". However, SMT components are more prone to becoming detached than through-hole components. SMT-through-hole hybrids typically suffer from two drawbacks, typically being on the one hand wasteful of "real estate" which is dedicated to through-holes rather than to crowding additional functional components into the available space (real estate) on the PCB, and, on the other hand, the pins soldered to the component or solder side layer may detach.

Certain embodiments seek to resolve unsatisfactory soldering results that occur when welding a tiny component to a comparatively large surface that is hard to heat to the melting temperature of the surface's material e.g. copper. According to certain embodiments, slots are provided in the ground surface which at least partly surround the conductor e.g. surround most of the conductor so that the galvanic connection between the conductor soil and the electric board's ground will still be maintained, as will thermal flow to the connector pad.

Certain embodiments seek to provide a solution for the tendency of SMT components to become disengaged from the electronic board by providing a structure which allows sufficient heating of the relevant portion of the electronic board during soldering to be achieved, thereby to reduce occurrence of detachments due to SMT components having been soldered when at too low a heat.

There are thus provided at least the following embodiments:

Embodiment 1. Printed circuit board (PCB) apparatus comprising: an apertured ground plane defining at least one aperture pattern in the ground plane, wherein each aperture pattern includes apertures which, taken together, surround most but not all of at least one SMT footprint and are interspersed with at least one ground plane region/s (aka bridges, breaks) which provide/s the SMT component with electrical connectivity to area/s of the ground plane other than the SMT footprint, thereby to maintain functionality of the SMT component including electrical connectivity between the SMT footprint and area/s of the ground plane other than the SMT footprint, while also slowing heat dissipation from the SMT footprint by restricting thermal conductivity between the area and the area's vicinity thereby to raise the temperature in the SMT footprint while a SMT component is being soldered thereto, thereby to at least partly prevent improper soldering of the SMT component which may cause the SMT component to subsequently detach from the board.

Embodiment 2. Apparatus according to claim 1 wherein the bridges include first and second ground plane regions which, respectively, provide the SMT component with electrical connectivity to neighboring SMT components in respective first and second directions.

Embodiment 3. Apparatus according to any of the preceding embodiments wherein the SMT component comprises a connector associated with an RF trace.

Embodiment 4. Apparatus according to any of the preceding embodiments wherein the aperture pattern comprises a sequence of apertures arranged along at least one curve.

Embodiment 5. Apparatus according to any of the preceding embodiments wherein the at least one curve comprises a single curve including 2 linear portions respectively extending along both sides of the RF trace, and a circular portion intermediate the linear portions which encircles the connector.

Embodiment 6. Apparatus according to any of the preceding embodiments wherein at least some of the apertures are elongate apertures arranged end-to-end along the curve.

Embodiment 7. Apparatus according to any of the preceding embodiments wherein at least some of the apertures comprise circles.

Embodiment 8. Apparatus according to any of the preceding embodiments wherein the SMT component comprises a filter.

Embodiment 9. Apparatus according to any of the preceding embodiments wherein the SMT component comprises an amplifier.

Embodiment 10. Apparatus according to any of the preceding embodiments and also comprising at least one PCB layer other than the apertured ground plane.

Embodiment 11. Apparatus according to any of the preceding embodiments wherein the PCB layer comprises a print side/component side layer.

Embodiment 12. Apparatus according to any of the preceding embodiments wherein the first direction extends along a first axis and the second direction extends along a second axis perpendicular to the first axis.

Embodiment 13. Apparatus according to any of the preceding embodiments wherein the at least one footprint comprises at least one surface-mount technology pad.

Embodiment 14. A method for manufacturing a PCB apparatus, the method comprising:
providing a PCB including an apertured ground plane and SMT footprints in the ground plane, the aperture ground plane having aperture patterns partly surrounding at least some SMT footprints.

Embodiment 15. A method according to any of the preceding embodiments and also comprising heating the PCB ground plane and soldering at least one SMT component, at the designated SMT footprints respectively.

Embodiment 16. Apparatus according to any of the preceding embodiments wherein the apertures occupy 50-80% of each partially surrounded SMT footprint's perimeter, the perimeter comprising a closed curve which surrounds the SMT component.

Embodiment 17. Apparatus according to any of the preceding embodiments wherein the perimeter extends through at least some of the apertures in the aperture pattern.

Embodiment 18. Apparatus according to any of the preceding embodiments wherein, for each aperture in the aperture pattern, the perimeter either extends through the aperture, or surrounds the aperture.

Embodiment 19. Apparatus according to any of the preceding embodiments wherein d is between 1-2 mm.

Embodiment 20. Apparatus according to any of the preceding embodiments wherein m is between 0.3-3 mm.

Embodiment 21. Apparatus according to any of the preceding embodiments wherein w is between 0.1 and 1 mm.

Embodiment 22. A computer program product, comprising a non-transitory tangible computer readable medium having computer readable program code embodied therein, the computer readable program code adapted to be executed to implement a method for manufacturing PCB apparatus, the method comprising: providing a PCB including an apertured ground plane and SMT footprints in the ground plane, the aperture ground plane having aperture patterns partly surrounding at least some SMT footprints.

The embodiments referred to above, and other embodiments, are described in detail in the next section.

Any trademark occurring in the text or drawings is the property of its owner and occurs herein merely to explain or illustrate one example of how an embodiment of the invention may be implemented.

Unless specifically stated otherwise, as apparent from the following discussions, it is appreciated that throughout the specification discussions, utilizing terms such as, "processing", "computing", "estimating", "selecting", "ranking", "grading", "calculating", "determining", "generating", "reassessing", "classifying", "generating", "producing", "stereo-matching", "registering", "detecting", "associating", "superimposing", "obtaining" or the like, refer to the action and/or processes of at least one computer/s or computing system/s, or processor/s or similar electronic computing device/s, that manipulate and/or transform data represented as physical, such as electronic, quantities within the computing system's registers and/or memories, into other data similarly represented as physical quantities within the computing system's memories, registers or other such information storage, transmission or display devices. The term "computer" should be broadly construed to cover any kind of electronic device with data processing capabilities, including, by way of non-limiting example, personal computers, servers, embedded cores, computing systems, communication devices, processors (e.g. digital signal processor (DSP), microcontrollers, field programmable gate array (FPGA), application specific integrated circuit (ASIC), etc.) and other electronic computing devices.

Elements separately listed herein need not be distinct components and alternatively may be the same structure. A statement that an element or feature may exist is intended to include (a) embodiments in which the element or feature exists; (b) embodiments in which the element or feature does not exist; and (c) embodiments in which the element or feature exist selectably e.g. a user may configure or select whether the element or feature does or does not exist.

Methods and systems included in the scope of the present invention may include some (e.g. any suitable subset) or all of the functional blocks shown in the specifically illustrated implementations by way of example, in any suitable order e.g. as shown.

Computational, functional or logical components described and illustrated herein can be implemented in various forms, for example, as hardware circuits such as but not limited to custom VLSI circuits or gate arrays or programmable hardware devices such as but not limited to FPGAs, or as software program code stored on at least one tangible or intangible computer readable medium and executable by at least one processor, or any suitable combination thereof. A specific functional component may be formed by one particular sequence of software code, or by a plurality of such, which collectively act or behave or act as described herein with reference to the functional component in question. For example, the component may be distributed over several code sequences such as but not limited to objects, procedures, functions, routines and programs, and may originate from several computer files which typically operate synergistically.

Any logical functionality described herein may be implemented as a real time application if and as appropriate and which may employ any suitable architectural option such as but not limited to ASIC or DSP or any suitable combination thereof. Any hardware component mentioned herein may in fact include either one or more hardware devices e.g. chips, which may be co-located or remote from one another.

DETAILED DESCRIPTION OF CERTAIN EMBODIMENTS

Surface-mount technology (SMT) is an electronic circuit generating method where components are mounted onto the surface of printed circuit boards (PCBs). An electronic device made using this method is termed a surface-mount device (SMD). SMT components are typically mounted on ("on board") a PCB layer, typically the component side layer or solder side layer, and typically have pins which are soldered to the component or solder side layer. Through-hole components differ from SMT components in that their pins extend along through holes, rather than being soldered to the component side layer or solder side layer.

Pure SMT components (such as, for example, MMCX SMT components, are components mounted on a component side layer or solder side layer, all of whose pins are soldered to the component or solder side layer.

Hybrid SMT components (aka SMT-through-hole hybrids) are components (typically connectors) mounted on a component side layer or solder side layer some or most, but not all, of whose pins are soldered to the component or solder side layer, whereas others of its pins extend along through-holes, rather than being soldered to the component side layer or solder side layer, typically to ensure firm attachment of the hybrid SMT component to the component/solder side layer. For example, the four "corner" pins of a hybrid connector may extend through four respective through-holes, whereas the connector's main trace may be SMT.

A method for generating a PCB may include some or all of the following operations, suitably ordered e.g. as shown:
1. Using any conventional PCB design software (such as altium, eagle, orcad, easyeda, mentor graphics, cadstar, circuitmaker/studio, sprint-layout, kicad) design, the PCB including:

A. Designing a PCB ground plane

B. Designing SMT footprints in the PCB ground plane

C. Designing aperture patterns in the PCB ground plane partly surrounding at least some SMT footprints. Typically, the apertures forming the pattern occupy 50 to 80% of each partially surrounded SMT footprint's perimeter, while 30 to 50% of the perimeter (e.g. the portion of the perimeter adjacent to the trace 10) remains intact, rather than being apertured). Typically, this limitation and the limitation/s on the size of d described herein and the limitation/s on the size of m described herein and the limitation/s on the size of w described herein, are provided in any suitable combination or sub-combination. Thus, all four limitations may be adhered to, or any three thereof, or any two thereof, or any one thereof. The computer program product which is generated in operation 1 is termed herein a "design file".

2. Using the "design file" generated in operation 1, manufacture or assemble PCB including a ground plane with aperture patterns partly surrounding SMT footprints using any conventional PCB manufacturing or assembly facility such as, say, Eltek, P.C.B. or PCL. It is appreciated that if the aperture patterns include circular apertures or drills as shown e.g. in FIGS. 8-10, or consist of only circular apertures or drills, the circular apertures or drills may be formed using a drilling machine which may be easier and/or faster than milling.

3. Heat the PCB ground plane, typically using a conventional soldering temperature profile.

4. Using conventional SMT methodology and conventional and soldering time, solder SMT components, manually or automatically, at the designated ground plane locations surrounded at least partly by the aperture patterns.

Regarding operation 1, and with reference also to the embodiments of FIGS. 1-10, when designing the PCB, the distance d between the aperture pattern (or pattern of air gaps) 45, and SMT component footprint is typically 1-1.5 mm and typically no larger than d=2 mm. It is appreciated that the distance between various portions of the aperture pattern and the SMT component footprint may or may not be uniform, and the distance d is the shortest distance between a point in the aperture pattern and a point in the SMT component footprint.

The closer the aperture pattern is to the SMT footprint 20 of the SMT component to be mounted on that footprint, the better the eventual soldering of the SMT component on the footprint 20, because minimizing the distance d between the footprint and the aperture pattern optimizes thermal conditions. However, the distance is selected to be large enough to ensure sufficient mechanical strength of the portion 30 of the PCB ground layer which is intermediate the aperture pattern and footprint, to prevent breakage of this portion if subjected, e.g. accidentally, to mechanical force.

To ensure electrical connectivity between the SMT component and its neighboring components and simultaneously maintain thermal conductivity and structural strength, the aperture width w (which may be defined along an axis radiating outward from the SMT component's center of gravity or may be defined perpendicular to the width m) is typically determined subject to the following limitation: less than 1 mm, such as within a range of 0.1-0.5 mm.

The width m of the breaks aka bridges 40 between apertures 45 in the aperture pattern (the minimal distance between bridges) is typically determined subject to the following limitation: no more than 3 mm, typically a value between 0.3 mm and 2 mm, such as 0.5 mm.

The distance d between the connector footprint and aperture pattern is typically determined subject to the following limitation: less than d=2 mm, e.g. between 1 and 1.5 mm. Alternatively, any other set of parameters may be chosen for specific use-cases or technologies, such that suitable levels of structural strength, thermal conductivity and electrical connectivity, are simultaneously provided. In general, large w, small m and small d each facilitate thermal conductivity by increasing insulation from the ground plane but may hamper electrical connectivity. Conversely, small w, large m and large d each may hamper thermal conductivity but facilitate electrical connectivity, since more traces are available to electrically connect the connector (or other component) to the ground plane. Small w values also reduce the length of the bridges 40 which tends to prevent the connector (or other component) becoming detached due to a mechanical blow to the device. Large d and m values also respectively enhance mechanical strength.

Regarding operation 1B above, in the drawings the perimeter is designated using a dotted line 50. As shown, the perimeter typically comprises an imaginary line connecting the apertures and surrounding the SMT component, therefore typically intersecting the SMT component's trace 10. The imaginary line typically connects all the apertures, but may connect only some of the apertures as shown in FIG. 9, in which case the remaining apertures are themselves surrounded by the imaginary line. In the example of FIG. 9, three of the apertures are not connected by the imaginary line and are instead surrounded thereby. The imaginary line typically extends along the aperture's center-lines, but it may be noted that in FIG. 7 for example, the imaginary line does not extend along the center-lines of the four slots which are radially disposed. The dotted line, aka perimeter in FIGS. 1-10, denotes a closed curve which bounds or surrounds the component. Typically, the apertures forming the pattern occupy 50-80% of each partially surrounded SMT footprint's perimeter, while 30-50% of the perimeter remains intact rather than being apertured. Typically, the perimeter is, for this purpose, taken to be the closed curve which bounds or surrounds the component which is of minimal area relative to the set of all closed curves which bounds or surrounds the component. Or, the perimeter is, for this purpose, taken to be the closed curve which bounds or surrounds the component which is of minimal length relative to the set of all closed curves which bounds or surrounds the component.

Regarding operation 4, assembly of the component on the PCB by soldering typically proceeds in a conventional fashion.

Figure 1:
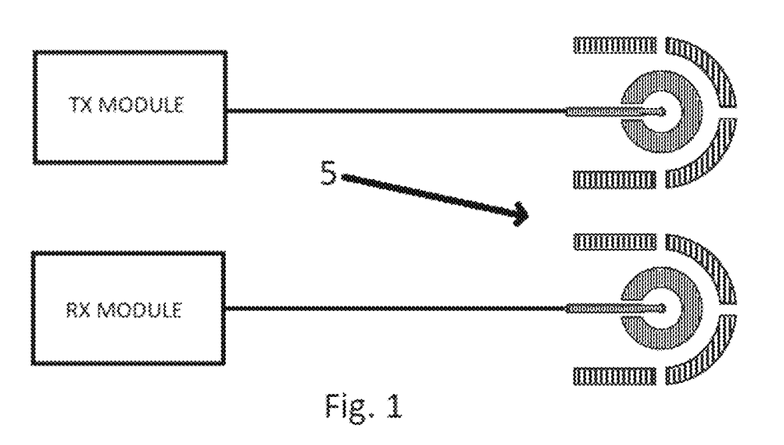
FIGS. 1-10 are simplified pictorial illustrations of a PCB apparatus or portions thereof, constructed and operative in accordance with certain embodiments of the present invention, where in all of FIGS. 2-5, 8 the SMT components are respective GPO connectors, in FIG. 6 the SMT component is a filter, in FIG. 7 the SMT component is a MMCX connector, in FIG. 9 the SMT component is an MMCX connector and in FIG. 10 the SMT component is an SMP/mini SMP/MMCX connector.

FIG. 1 is an example of a printed circuit board (PCB) apparatus, which includes transmitter and receiver modules, although this is not intended to be limiting, and alternatively any PCB apparatus or any RF-board may be employed. As shown, the PCB apparatus includes an apertured ground plane defining at least one aperture pattern in the ground plane wherein each aperture pattern includes apertures (e.g. gaps, slots, engravings, holes) which, taken together, surround most but not all of the perimeter of at least one SMT connector area. In the illustrated embodiment, two SMT connector areas, aka SMT connector footprints, are shown, each partially surrounded (i.e. around most of its perimeter) by a horse-shoe shaped aperture pattern including two linear apertures and two curved apertures. These apertures, in each of the two aperture patterns, are interspersed with, or separated by, three one-ground plane regions, aka bridges in three respective orthogonal directions, the fourth orthogonal direction being that of the trace 10 providing electrical communication between the connector and the TX (or RX) module. The bridges, generally, provide/s the SMT component with electrical connectivity to area/s of the ground plane other than the SMT footprint, thereby to maintain functionality of the SMT component including electrical connectivity between the SMT footprint and area/s of the ground plane other than the SMT footprint. The aperture pattern also slows heat dissipation from the SMT footprint by restricting thermal conductivity between the area and the area's vicinity, thereby to raise the temperature in the SMT footprint while a SMT component is being soldered thereto. This at least partly prevents improper (due to insufficient heating of the SMT footprint) soldering of the SMT component to the SMT footprint, which in turn may cause the SMT component to subsequently detach from the board.

Figure 2:
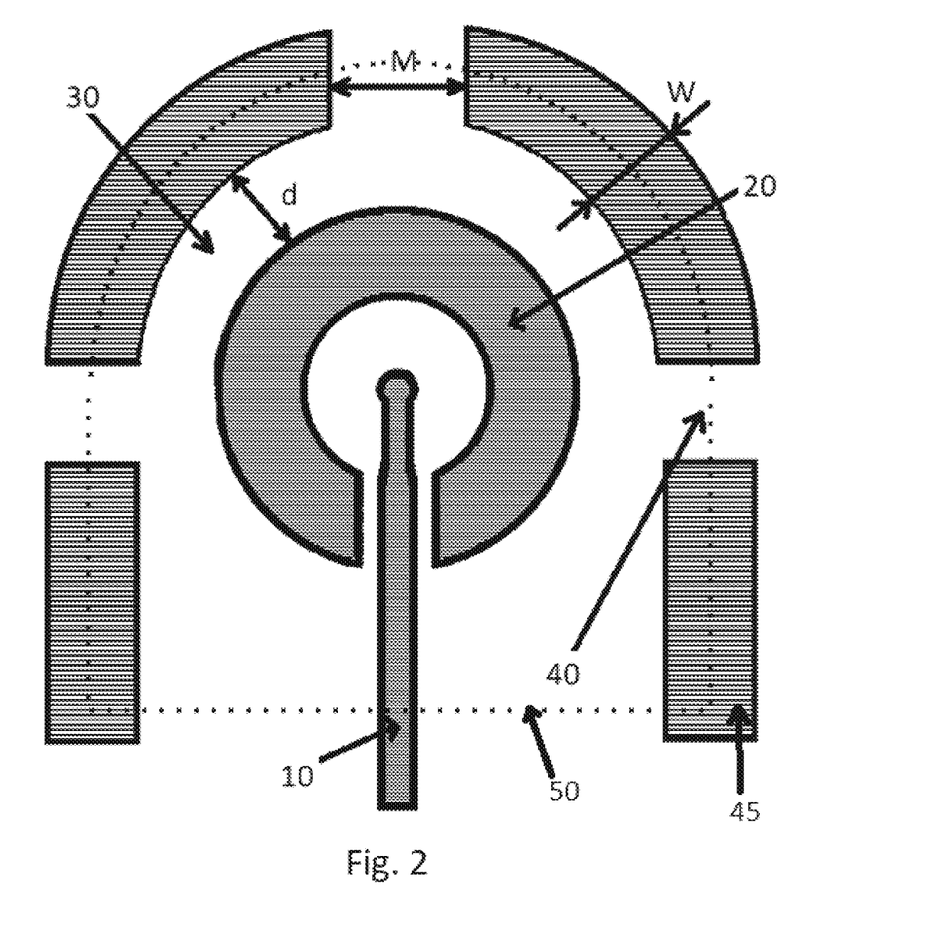

It is appreciated that the particular geometry of the aperture pattern in FIG. 1 is not intended to be limiting. Other example aperture patterns are shown in FIGS. 4 to 9 and in particular FIG. 2, shows the same geometry as FIG. 1. As shown, the bridges include first and second ground plane regions which, respectively, provide the SMT component with electrical connectivity to neighboring SMT components in respective first and second (e.g. horizontal and vertical) directions. It is appreciated that more generally, the at least one ground plane regions may respectively provide/s the SMT component with electrical connectivity to neighboring SMT components in at least one direction/s, thereby to maintain functionality of the SMT component including electrical connectivity between the SMT footprint in all of the at least one direction/s. In FIG. 2, the first direction extends along a first horizontal axis and the second direction extends along a second, vertical axis perpendicular to the first axis, however this need not be the case.

Figure 3:
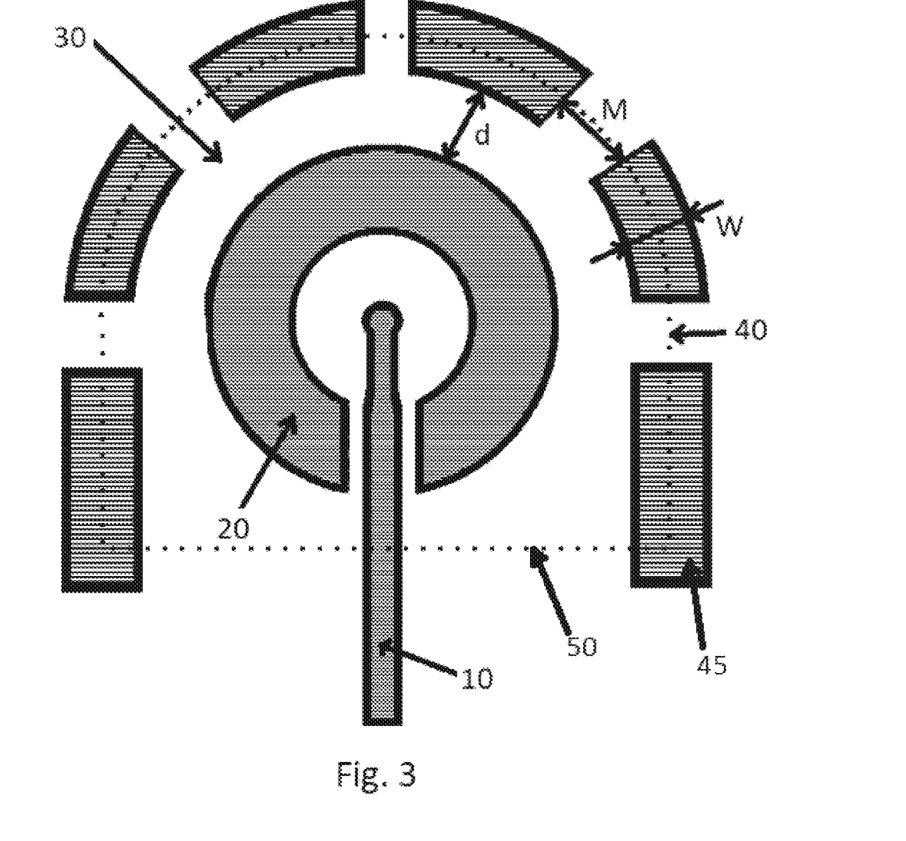
Figure 4:
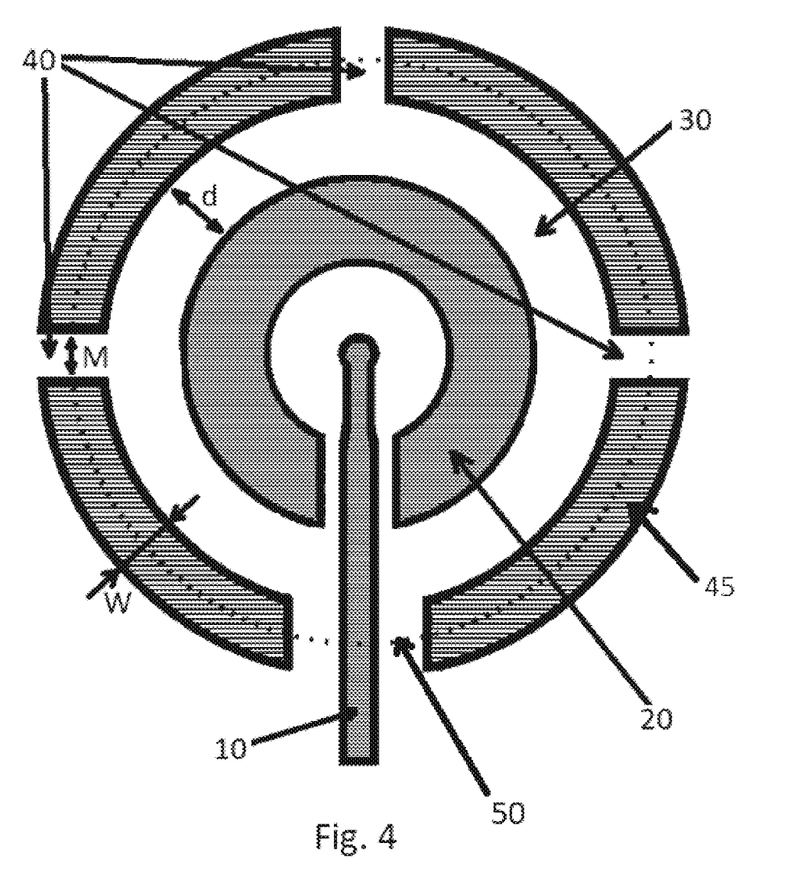
Figure 6:
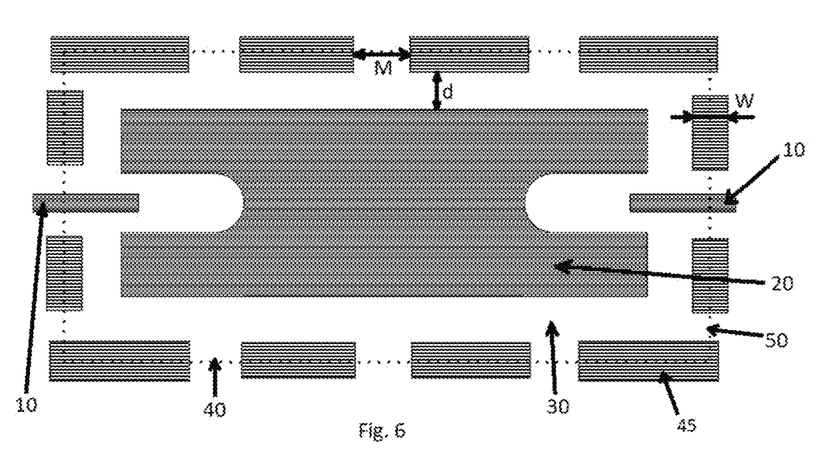
Figure 7:
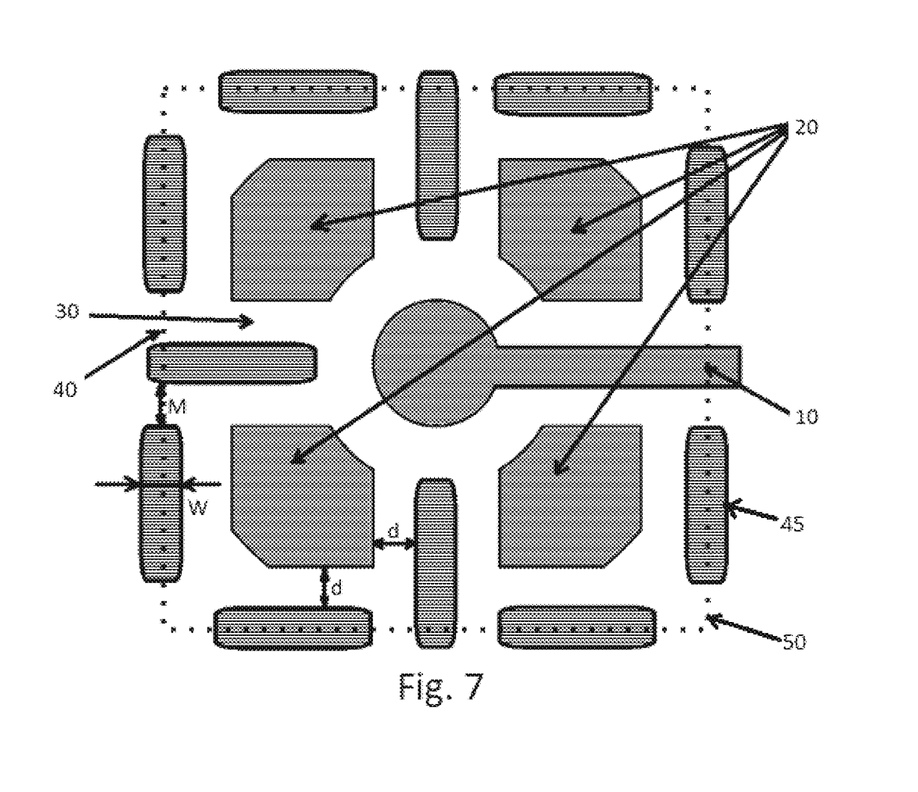

FIG. 3 shows a horse-shoe pattern similar to FIG. 2, however, more breaks are provided (five rather than three) hence each aperture comprises a slot as in FIG. 2, however the slots are shorter. The relative orientation of the bridges is not intended to be limiting; the bridges need not be evenly distributed about the azimuth surrounding the SMT footprint and it is not necessarily the case that some bridges are perpendicular to the trace 10. FIG. 4's aperture pattern also surrounds the SMT footprint however, the pattern rather than being shaped like a horse-shoe, is almost circular (i.e. at least a semi-circle but less than a complete circle) as shown. In FIG. 4, four curved slots interspersed with four bridges are shown, whereas in FIG. 5, there are eight shorter slots interspersed with eight bridges. In FIG. 6, an aperture pattern is shown which is particularly suitable for rectangular SMT components such as filters. As shown, the apertures in the pattern of FIG. 6 are linear or rectangular, rather than curved. FIG. 7 illustrates an aperture pattern (suitable inter alia for MMCX use-cases) in which apertures are elongate as in the previously described drawings, and some of the elongate apertures extend, as in the previous drawings, along the perimeter of the SMT footprint. However, others of the elongate apertures extend perpendicular to the perimeter of the SMT component. Also, note that the SMT footprint being surrounded is square in FIG. 7 as opposed to being rectangular generally, in FIG. 6.

Figure 5:
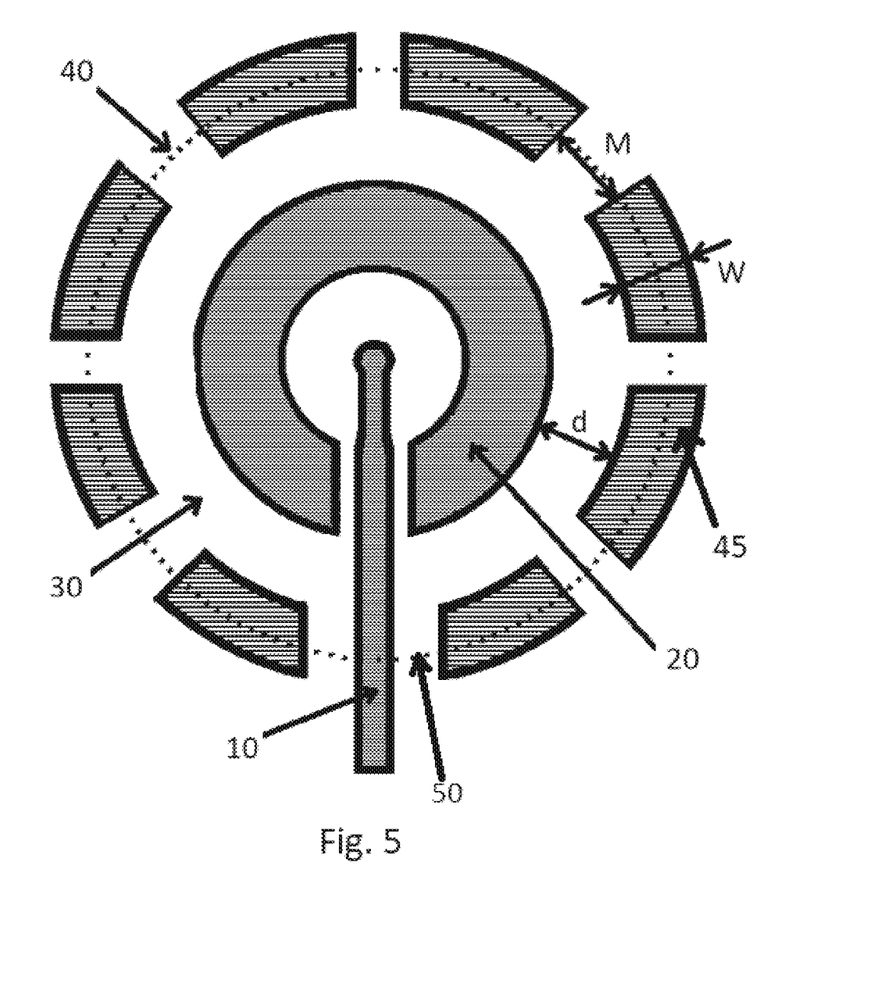
Figure 8:
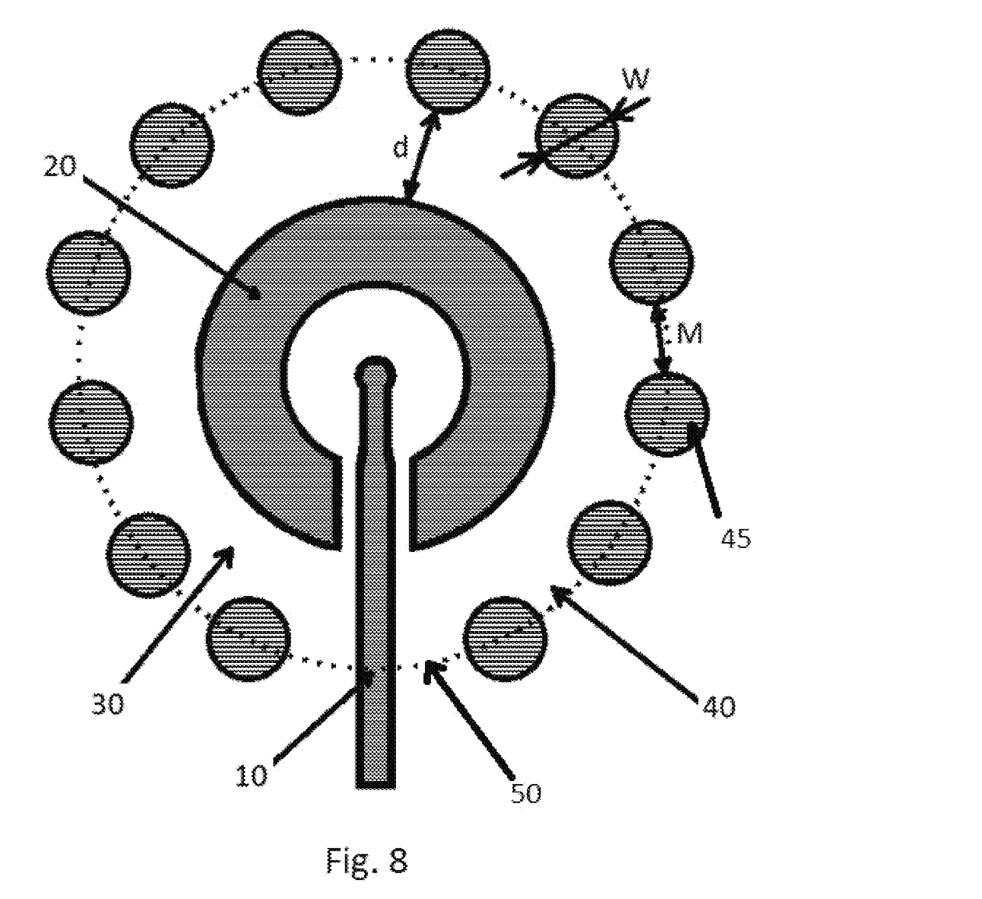
Figure 9:
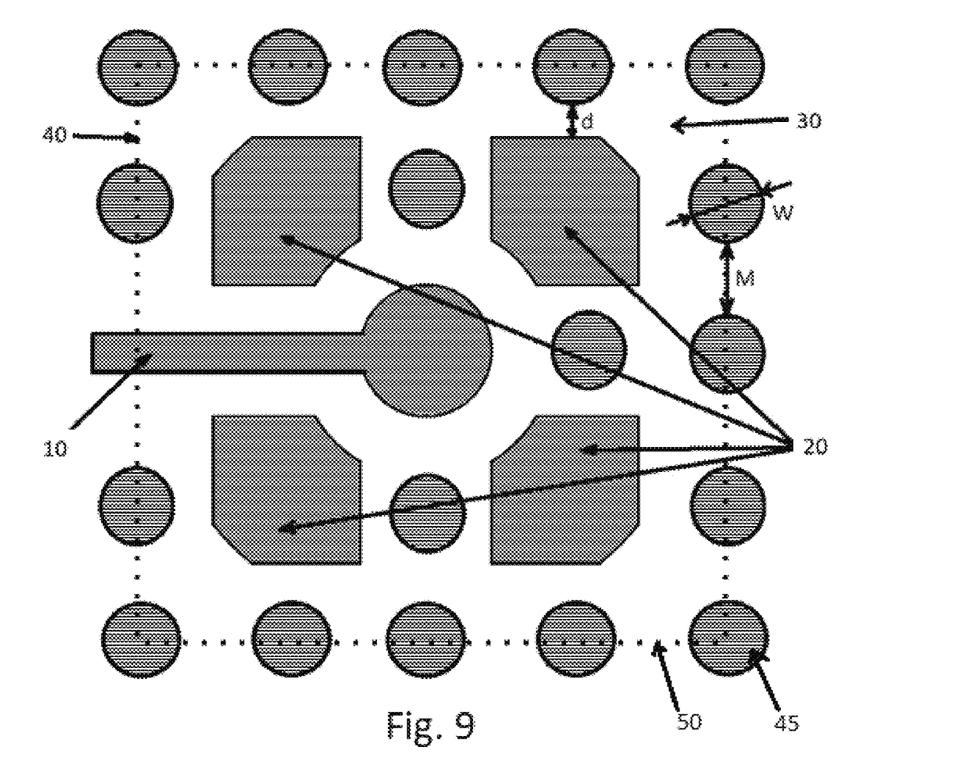
Figure 10:
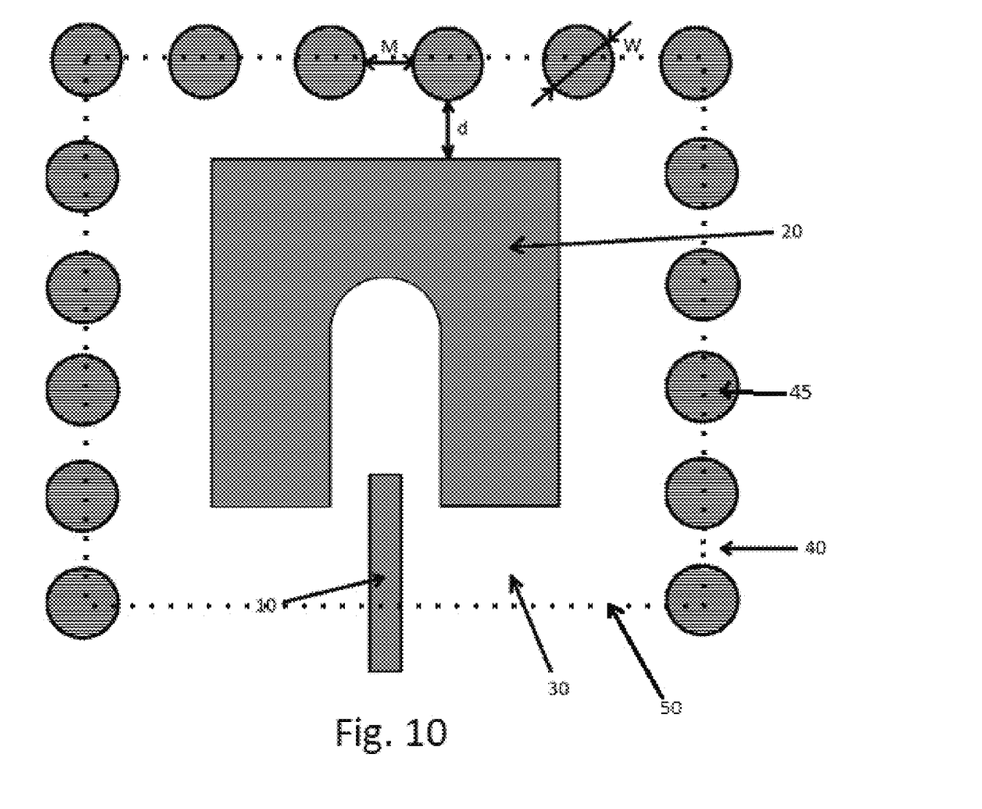

The aperture pattern of FIG. 8 is similar to that of FIGS. 4 and 5 i.e. generally circular, however the apertures are circular rather than being elongate slots. The apertures in FIG. 8 are generally evenly spaced although this need not be the case. The apertures in FIG. 8 (or in others of the figures) need not be arranged along a square or rectangle or circle; they may be instead arranged along any other curve or even along plural curves nested one within another. FIG. 9 is another embodiment suitable for MMCX use cases similar to the embodiment of FIG. 7, however in the embodiment of FIG. 9 the apertures are, again, circular rather than elongate. FIG. 10 is still another embodiment in which the footprint illustrated is that of a rectangular connector.

Use Cases

Some use-cases such as RF-boards are characterized by a demand for high electric isolation to prevent electromagnetic radiation associated with the RF card (or RF-board) from interfering with nearby systems. For example, simultaneously operative TX and RX channels may interfere with one another, absent sufficient electric isolation. Such isolation may be achieved be implemented by adding a ground plane or copper plate, as large as possible, atop the external layer of the PCB, typically in all areas where there are no traces, perhaps even a copper plate which is the same size as the entire RF- board, so as to lock in the electromagnetic radiation thereby preventing interference. Electrical components may be deployed on this ground plane. In such use-cases, providing aperture patterns partly surrounding SMT components as described, improves the quality of the soldering of the SMT components.

Some use cases involve a connector, e.g. of an RF board in a miniature system, which is frequently connected and disconnected e.g. for the purposes of frequent and even daily testing, charging, or other frequently repeated operations. It is appreciated that in such cases, the connector is particularly apt to become disengaged over time hence embodiments herein are particularly useful.

Applicability however includes any suitable use-case such as any component which is soldered to ground e.g. a filter or connector inter alia.

A particular advantage of certain embodiments is that absent the methods described herein, a frequent scenario is that a connector or other SMT component simply detaches from the electronic board and may even pull its trace 10 right out of the electronic board. It should be noted that regarding trace 10, the pad of the pin where the trace starts or interfaces the plane, is in fact a footprint. It should further be noted that electronic boards or RF modules are often packaged in enclosures made of any suitable material/s such as metal e.g. aluminum or a suitable plastic, along with multiple cables and additional electrical components. Unfortunately this scenario tends to occur while the technician is completing his final testing of the entire package, requiring the enclosure to be opened and its contents to be disassembled until the board can be removed and either fixed or replaced, at which point the entire package is reassembled, however all electrical and other testing procedures would then need to begin anew.

Another particular advantage of certain embodiments is that legacy soldering equipment may continue to be employed; no new temperature profile of the soldering oven is required, nor is customized equipment required.

It is appreciated that FIG. 1 inter alia including the ground layer, is not necessarily drawn to scale and furthermore that the positions of the modules and SMT components and aperture patterns on the ground layer need not be as shown, and furthermore that additional modules and SMT components (and associated aperture patterns) may be provided although they are not shown.

It is appreciated that the particular embodiments herein are not intended to be limiting. The invention is intended to include for example any embodiments operative in conjunction with CPUs or processors which have, on the inside, signals which are the result of decoding of instructions about to be executed. According to these embodiments, these signals are sent out of the CPU, thereby to allow at least one operative unit outside the CPU to act based on these signals' states, thereby to utilize signals available in one context and designed for CPU-internal purposes for another, typically CPU-external purpose in a typically CPU-external location or context. For example, responsive to real time indication/s of which op-code/instruction is about to be executed, a sensitivity level control module in the security system may adjust, on-the-fly e.g. in real time, the sensitivity level (aka security level) of fault injection detector functionality in countermeasure circuitry operative to counter fault injection attacks.

Firmware, if used to implement certain embodiments herein, may be held in nonvolatile memory, e.g. Flash or ROM. Any suitable technology may be used to prevent limitations of the location of the firmware from interfering with flash management.

Alternatively, certain embodiments described herein may be implemented partly or exclusively (i.e. without firmware) in hardware, in which case some or all of the variables, parameters, sequential operations and computations described herein may be in hardware.

It is appreciated that terminology such as "mandatory", "required", "need" and "must" refer to implementation choices made within the context of a particular implementation or application described herewithin for clarity and are not intended to be limiting, since, in an alternative implementation, the same elements might be defined as not mandatory and not required, or might even be eliminated altogether.

Features of the present invention, including operations, which are described in the context of separate embodiments, may also be provided in combination in a single embodiment. For example, a system embodiment is intended to include a corresponding process embodiment and vice versa. Also, each system embodiment is intended to include a server-centered "view" or client centered "view", or "view" from any other node of the system, of the entire functionality of the system, computer-readable medium, apparatus, including only those functionalities performed at that server or client or node. Features may also be combined with features known in the art and particularly, although not limited to those described in the Background section or in publications mentioned therein. Conversely, features of the invention, including operations, described for brevity in the context of a single embodiment or in a certain order may be provided separately or in any suitable subcombination, including with features known in the art (particularly although not limited to those described in the Background section or in publications mentioned therein) or in a different order. "e.g." is used to denote an example not intended to be limiting. Each method may comprise some or all of the operations illustrated or described, suitably ordered e.g. as illustrated or described herein.

The invention claimed is:

1. Printed circuit board (PCB) apparatus comprising:
   an apertured ground plane defining at least one aperture pattern in the ground plane,
   wherein each aperture pattern includes apertures which, taken together, surround most but not all of at least one SMT footprint and are interspersed with at least one ground plane region/s (aka bridges, breaks) which provide/s the SMT component with electrical connectivity to area/s of said ground plane other than said SMT footprint,
   thereby to maintain functionality of the SMT component including electrical connectivity between said SMT footprint and area/s of said ground plane other than said SMT footprint, while also slowing heat dissipation from the SMT footprint by restricting thermal conductivity between said area and said area's vicinity thereby to raise the temperature in the SMT footprint while a SMT component is being soldered thereto,
   thereby to at least partly prevent improper soldering of the SMT component which may cause the SMT component to subsequently detach from the board,
   wherein said apertures occupy 50-80% of each partially surrounded SMT footprint's perimeter, the perimeter comprising a closed curve which surrounds the SMT component.

2. Apparatus according to claim 1 wherein said bridges include first and second ground plane regions which, respectively, provide the SMT component with electrical connectivity to neighboring SMT components in respective first and second directions.

3. Apparatus according to claim 1 wherein said SMT component comprises a connector associated with an RF trace.

4. Apparatus according to claim 1 wherein the aperture pattern comprises a sequence of apertures arranged along at least one curve.

5. Apparatus according to claim 4 wherein said SMT component comprises a connector associated with an RF trace and wherein said at least one curve comprises a single curve including 2 linear portions respectively extending along both sides of the RF trace, and a circular portion intermediate the linear portions which encircles the connector.

6. Apparatus according to claim 4 wherein at least some of said apertures are elongate apertures arranged end-to-end along said curve.

7. Apparatus according to claim 4 wherein at least some of said apertures comprise circles.

8. Apparatus according to claim 1 wherein said SMT component comprises a filter.

9. Apparatus according to claim 1 wherein said SMT component comprises an amplifier.

10. Apparatus according to claim 1 and also comprising at least one PCB layer other than the apertured ground plane.

11. Apparatus according to claim 10 wherein said PCB layer comprises a print side / component side layer.

12. Apparatus according to claim 2 wherein said first direction extends along a first axis and said second direction extends along a second axis perpendicular to the first axis.

13. Apparatus according to claim 12 wherein the at least one footprint comprises at least one surface-mount technology pad.

14. Apparatus according to claim 1 wherein said apertures occupy 50-80% of the closed curve which surrounds the SMT component.

15. Apparatus according to claim 14 wherein the closed curve extends through at least some of the apertures in the aperture pattern.

16. Apparatus according to claim 14 wherein, for each aperture in the aperture pattern, the closed curve either extends through said aperture, or surrounds said aperture.

17. Apparatus according to claim 14 wherein d is between 1-2 mm.

18. Apparatus according to claim 17 wherein m is between 0.3-3 mm.

19. Apparatus according to claim 18 wherein w is between 0.1 and 1 mm.

20. A method for manufacturing Printed circuit board (PCB) apparatus, the method comprising:
   providing an apertured ground plane defining at least one aperture pattern in the ground plane,
   wherein each aperture pattern includes apertures which, taken together, surround most but not all of at least one SMT footprint and are interspersed with at least one ground plane region/s (aka bridges, breaks) which provide/s the SMT component with electrical connectivity to area/s of said ground plane other than said SMT footprint,
   thereby to maintain functionality of the SMT component including electrical connectivity between said SMT footprint and area/s of said ground plane other than said SMT footprint, while also slowing heat dissipation from the SMT footprint by restricting thermal conductivity between said area and said area's vicinity thereby to raise the temperature in the SMT footprint while a SMT component is being soldered thereto, thereby to at least partly prevent improper soldering of the SMT component which may cause the SMT component to subsequently detach from the board wherein said apertures occupy 50-80% of each partially surrounded SMT footprint's perimeter, the perimeter comprising a closed curve which surrounds the SMT component.

21. A computer program product, comprising a non-transitory tangible computer readable medium having computer readable program code embodied therein, said computer readable program code adapted to be executed to implement a method for manufacturing PCB apparatus, the method comprising:

providing an apertured ground plane defining at least one aperture pattern in the ground plane, wherein each aperture pattern includes apertures which, taken together, surround most but not all of at least one SMT footprint and are interspersed with at least one ground plane region/s (aka bridges, breaks) which provide/s the SMT component with electrical connectivity to area/s of said ground plane other than said SMT footprint, thereby to maintain functionality of the SMT component including electrical connectivity between said SMT footprint and area/s of said ground plane other than said SMT footprint, while also slowing heat dissipation from the SMT footprint by restricting thermal conductivity between said area and said area's vicinity thereby to raise the temperature in the SMT footprint while a SMT component is being soldered thereto, thereby to at least partly prevent improper soldering of the SMT component which may cause the SMT component to subsequently detach from the board wherein said apertures occupy 50-80% of each partially surrounded SMT footprint's perimeter, the perimeter comprising a closed curve which surrounds the SMT component.

22. A method according to claim 20 and also comprising heating the PCB ground plane and soldering at least one SMT component, at the designated SMT footprints respectively.

* * * * *